(12) United States Patent
Stefanoski

(10) Patent No.: US 7,551,442 B2
(45) Date of Patent: Jun. 23, 2009

(54) EMBEDDED HEAT PIPE IN A HYBRID COOLING SYSTEM

(75) Inventor: Zoran Stefanoski, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 303 days.

(21) Appl. No.: 11/294,825

(22) Filed: Dec. 5, 2005

(65) Prior Publication Data
US 2007/0125522 A1 Jun. 7, 2007

(51) Int. Cl.
*H05K 7/20* (2006.01)
(52) U.S. Cl. .................. 361/700; 361/699; 361/704; 361/719; 165/104.26; 165/104.33
(58) Field of Classification Search ............... 361/698, 361/700, 715, 704; 165/104.33, 104.21, 165/104.26; 257/713–715; 174/15.2, 16.3
See application file for complete search history.

(56) References Cited

U.S. PATENT DOCUMENTS

| | | | | |
|---|---|---|---|---|
| 4,931,905 | A * | 6/1990 | Cirrito et al. ............... | 361/700 |
| 5,355,942 | A * | 10/1994 | Conte .................... | 165/104.33 |
| 5,880,524 | A * | 3/1999 | Xie ........................... | 257/704 |
| 5,926,371 | A * | 7/1999 | Dolbear .................... | 361/704 |
| 6,082,443 | A * | 7/2000 | Yamamoto et al. ...... | 165/104.26 |
| 6,243,268 | B1 * | 6/2001 | Kang et al. ................ | 361/715 |
| 6,246,581 | B1 * | 6/2001 | Kang et al. ................ | 361/700 |
| 6,550,531 | B1 * | 4/2003 | Searls et al. ............ | 165/104.33 |
| 6,650,544 | B1 * | 11/2003 | Lai ............................ | 361/700 |
| 6,725,910 | B2 * | 4/2004 | Ishida et al. ........... | 165/104.26 |
| 7,032,652 | B2 * | 4/2006 | Wang et al. ............. | 165/104.26 |
| 7,145,774 | B2 * | 12/2006 | Campini et al. ............. | 361/719 |

(Continued)

FOREIGN PATENT DOCUMENTS

CN 1658123 8/2005

OTHER PUBLICATIONS

Scott D. Garner, PE., Thermacore Inc, "Heat Pipes for Electronics Cooling Applications" Electrics Cooling, Sep. 1996 pp. 1-10.

(Continued)

*Primary Examiner*—Jayprakash N Gandhi
*Assistant Examiner*—Courtney L Smith
(74) *Attorney, Agent, or Firm*—Patterson & Sheridan, LLP

(57) ABSTRACT

One embodiment of a system for cooling a heat-generating device includes a base adapted to be coupled to the heat-generating device, a housing coupled to the base, a liquid channel formed between the base and the housing, where a heat transfer liquid may be circulated through the liquid channel to remove heat generated by the heat-generated device, and a heat pipe disposed within the liquid channel, where the heat pipe increases the heat transfer surface area to which the heat transfer liquid is exposed. Among other things, the heat pipe advantageously increases the heat transfer surface area to which the heat transfer liquid is exposed and efficiently spreads the heat generated by the heat-generating device over that heat transfer surface area. The result is enhanced heat transfer through the liquid channel relative to prior art cooling systems.

19 Claims, 7 Drawing Sheets

U.S. PATENT DOCUMENTS

| | | | |
|---|---|---|---|
| 7,261,142 B2 * | 8/2007 | Kawahara et al. | 165/104.26 |
| 7,265,977 B2 * | 9/2007 | Martin et al. | 361/699 |
| 7,278,470 B2 * | 10/2007 | Xia et al. | 165/104.33 |
| 2005/0180106 A1 | 8/2005 | Ohashi et al. | |
| 2005/0226745 A1 * | 10/2005 | Seko et al. | 417/423.14 |
| 2005/0244291 A1 * | 11/2005 | Tomioka et al. | 417/423.7 |

OTHER PUBLICATIONS

Translation of Office Action for related Chinese patent application citing CN 1658123A (Citation Reference B1), dated May 30, 2008. Provided is an explanation of relevance of Citation Reference B1. Citation Reference A1 (US 2005/0180106) is the U.S. equivalent of Citation Reference B1.

* cited by examiner

EMBEDDED HEAT PIPE IN A HYBRID COOLING SYSTEM

BACKGROUND OF THE INVENTION

1. Field of the Invention

This invention relates generally to systems used to cool computer hardware and more particularly to an embedded heat pipe in a hybrid cooling system.

2. Description of the Background Art

FIG. 1 is an isometric view illustrating a prior art cooling system 100 used to cool heat-generating electronic devices in a computer system, such as a graphics processing unit (GPU). As shown, cooling system 100 characteristically includes a blower/fan 106, fins 109 and a bottom plate 111. Typically, cooling system 100 is thermally coupled to the GPU, for example using thermal adhesive or grease having thermal properties that facilitate transferring heat generated by the GPU to the bottom plate 111. Cooling system 100 may also include a heat sink lid (not shown), which, among other things, prevents particles and other contaminants from entering blower/fan 106 and air blown from blower/fan 106 from escaping cooling system 100. The heat sink lid, together with the fins 109 and the bottom plate 111, define a plurality of air channels 108.

Blower/fan 106 is configured to force air through air channels 108 over bottom plate 111 such that the heat generated by the GPU transfers to the air. The heated air then exits cooling system 100, as depicted by flow lines 114, thereby dissipating the heat generated by the GPU into the external environment. This process cools the GPU, preventing the device from overheating during operation. Persons skilled in the art will understand that air channels 108 typically are configured to direct air blown from blower/fan 106 over bottom plate 111 and into the external environment in a manner that most efficiently removes heat from the GPU.

FIG. 2 is a schematic diagram illustrating a computer system 200, such as a desktop, laptop, server, mainframe, set-top box, and the like within which a conventional cooling system 100 for cooling the GPU 216 is incorporated. As shown, computing device 200 includes a housing 201, within which a motherboard 204 resides. Mounted on motherboard 204 are a central processing unit (CPU) 206, a processor cooler 208 for cooling CPU 206, a system fan 210 for removing heat from computing device 200 and one or more peripheral component interface (PCI) cards 212, each interfaced with a slot located in the back part of housing 201. Motherboard 204 further incorporates a graphics card 202 that enables computing device 200 to rapidly process graphics related data for graphics intensive applications such as gaming applications. Graphics card 202 comprises a printed circuit board (PCB) upon which a plurality of circuit components (not shown), such as memory chips and the like, are mounted. In addition, graphics card 200 includes GPU 216, mounted to one face of graphics card 202, for processing graphics related data.

Because the computational requirements of GPU 216 are typically quite substantial, GPU 216 tends to generate a large amount of heat during operation. If the generated heat is not properly dissipated, the performance of GPU 216 degrades. For this reason, cooling system 100, which is configured to remove heat from GPU 216, is coupled to GPU 216.

One drawback of these conventional blower/fan cooling systems is that, as processors become more powerful and generate more heat, the fan has to be operated at very high speeds to generate the airflow through the air channels and over the heat sink necessary to cool the processor. High speed operation tends to produce a substantial amount of unwanted acoustic noise, which is annoying to users of a computer. Also, in some instances, these types of conventional cooling systems may not even be able to meet the heat dissipation requirements of certain high-performance processors. Further compounding these issues is the fact that, while processors are becoming more powerful, the available space for cooling systems within computing devices is generally not increasing. Thus, substantial improvements in the efficiency of cooling systems are required to maintain pace with the evolution of processors.

Liquid cooling systems are beginning to emerge as a viable alternative to conventional blower/fan cooling systems. A liquid cooling system dissipates heat at a much greater rate than a comparable air cooling system. However, typical liquid cooling systems are driven by large pumps, which are prone to frequent failure and tend to consume a great deal of power. Moreover, such systems tend to use large quantities of liquid, circulating at a high flow rate, and therefore must be frequently replenished or replaced.

To overcome some of these challenges, a hybrid cooling system is disclosed in U.S. patent application Ser. No. 10/822,958, filed on Apr. 12, 2004 and titled, "System for Efficiently Cooling a Processor," which is herein incorporated by reference. FIG. 3 is an isometric view of such a hybrid cooling system 300. Similar to the system 100, the hybrid cooling system 300 may be adapted for use in any type of appropriate computing device. As shown, hybrid cooling system 300 may include, without limitation, a fansink 302 and a hybrid cooling module 304. As described in further detail below, fansink 302 and hybrid cooling module 304 may operate independently or in combination to dissipate heat from a processor or other heat-generating device within the computer system.

Fansink 302 is configured in a manner similar to cooling system 100 of FIG. 1 and includes, without limitation, a fan 308, walls 306 and a bottom plate 318. Cooling system 300 also includes a heat sink lid 320, which, among other things, prevents particles and other contaminants from entering fan 308 and air blown from fan 308 from escaping system 300. Heat sink lid 320, together with walls 306 and bottom plate 318 of fansink 302, define a plurality of air channels 322.

Hybrid cooling module 304 is adapted to be integrated with fansink 302. Hybrid cooling module 304 is thermally coupled to a portion of bottom plate 318 and includes, without limitation, a liquid channel 312, an inlet 314, an outlet 316 and a plurality of air channels 310. Hybrid cooling module 304 is coupled to a pump, which is adapted for circulating a heat transfer liquid (e.g., water or any other liquid suitable for transferring heat) through a closed loop that includes liquid channel 312. As shown in FIG. 3, the pump circulates liquid from hybrid cooling module 304 through a heat exchanger prior to supplying the liquid back to hybrid cooling module 304. Inlet 314 and outlet 316 are configured for respectively supplying and removing the heat transfer liquid to liquid channel 312. Air channels 310 are adapted for coupling to air channels 322 and for transporting forced air from fan 308 to the local environment. Air channels 310 are positioned over and around liquid channel 312 such that liquid channel 312 is substantially enclosed within air channels 310.

When cooling a processor or other heat-generating device, fan 308 forces air through air channels 322 of the fansink 302 and air channels 310 of the hybrid cooling module 304 such that the heat generated by the processor transfers to the air as the air passes over bottom plate 318. The heated air then exits system 300, as depicted by flow lines 324, thereby dissipating the heat generated by the processor into the local environment. In addition, as previously described, the pump circulates the heat transfer liquid through liquid channel 312 of hybrid cooling module 304, and heat generated by the processor transfers to the circulating heat transfer liquid as well as to air in air channels 310. Liquid channel 312 is adapted for transporting heat transfer liquid through a downstream heat exchanger, which dissipates heat from the heat transfer liquid into the local environment.

Fansink 302 and hybrid cooling module 304 may be implemented independently or in combination to dissipate heat from a processor, in order to dissipate heat from the processor in the most efficient manner. For example, fansink 302 may be implemented to dissipate a majority of the generated heat, hybrid liquid cooling module 304 may be implemented to dissipate a smaller quantity of heat, and the proportions of heat dissipated by fansink 302 and hybrid cooling module 304 may be dynamically adjusted. Alternatively, one of fansink 302 and hybrid cooling module 304 may be implemented as a primary means for heat dissipation, while the other mechanism is implemented on an as-needed basis to dissipate excess heat.

One drawback to using the hybrid cooling system 300 is that, when the pump is inoperative and no heat transfer liquid is circulated through the liquid channel 312, a substantial amount of cooling capacity is lost because air cooling provided by the fansink 302 is limited to the air channels 310, 322 that are not obstructed by the liquid channel 312. In other hybrid cooling system configurations, the fansink and the liquid cooling module may be "stacked" such that the fansink is disposed on top of the hybrid cooling module. In such configurations, when the pump is inoperative and no heat transfer liquid is circulated through the liquid channel, the standing liquid in the liquid channel acts like an insulator and retards the heat transfer between the processor or other heat-generating device and the walls of the fansink air channels, substantially decreasing the cooling efficiency of the hybrid cooling system. In addition, when such a "stacked" hybrid cooling system is installed in a peripheral component interconnect (PCI) slot, height restrictions become a concern. Consequently, the height of the fansink air channels may be reduced to allow the system to fit within the allocated space. Reducing the height of the air channels reduces the effective heat transfer area of the air channels, further decreasing the cooling efficiency of the hybrid cooling system.

As the foregoing illustrates, what is needed in the art is a way to increase the efficiency of hybrid cooling systems, especially when the liquid cooling portion of the system is not being used.

SUMMARY OF THE INVENTION

One embodiment of a system for cooling a heat-generating device includes a base adapted to be coupled to the heat-generating device; a housing coupled to the base; a liquid channel formed between the base and the housing, wherein a heat transfer liquid may be circulated through the liquid channel to remove heat generated by the heat-generated device; and a heat pipe disposed within the liquid channel, wherein the heat pipe increases the heat transfer surface area to which the heat transfer liquid is exposed. Among other things, the heat pipe advantageously increases the heat transfer surface area to which the heat transfer liquid is exposed and efficiently spreads the heat generated by the heat-generating device over that heat transfer surface area. The result is enhanced heat transfer through the liquid channel relative to prior art cooling systems.

DETAILED DESCRIPTION OF THE INVENTION

Figure 1:
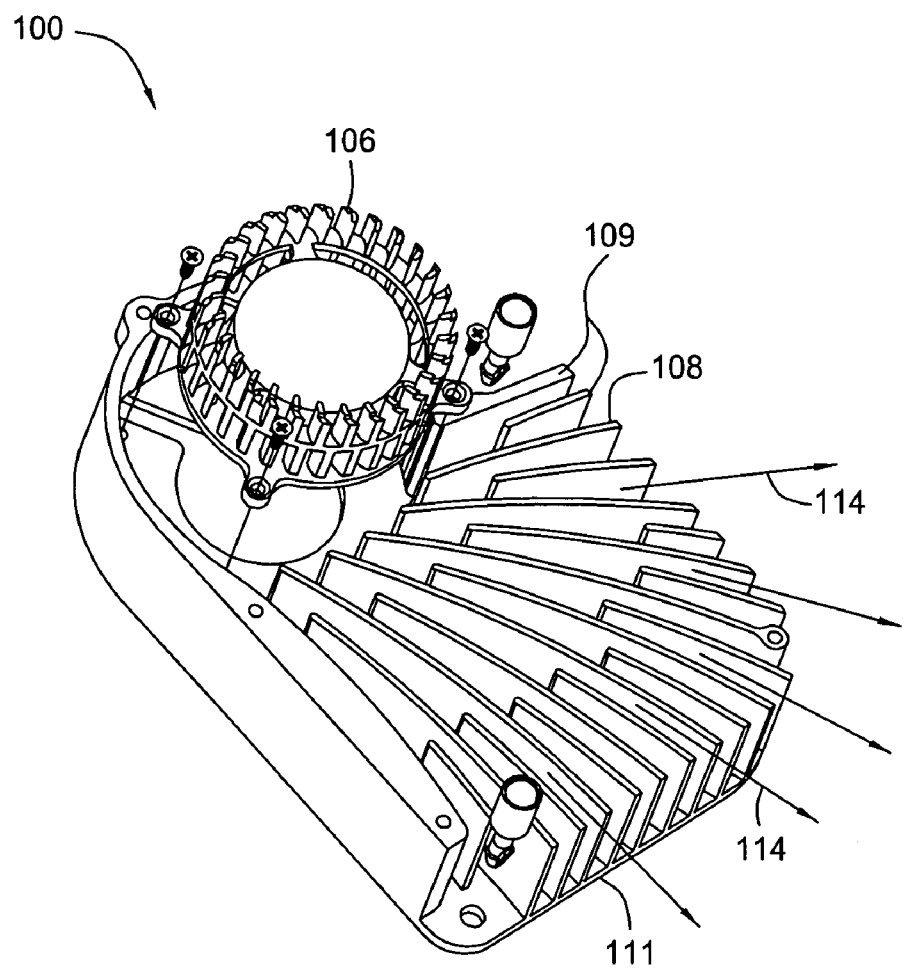
FIG. 1 is an isometric view illustrating a prior art system used to cool a processor.
Figure 2:
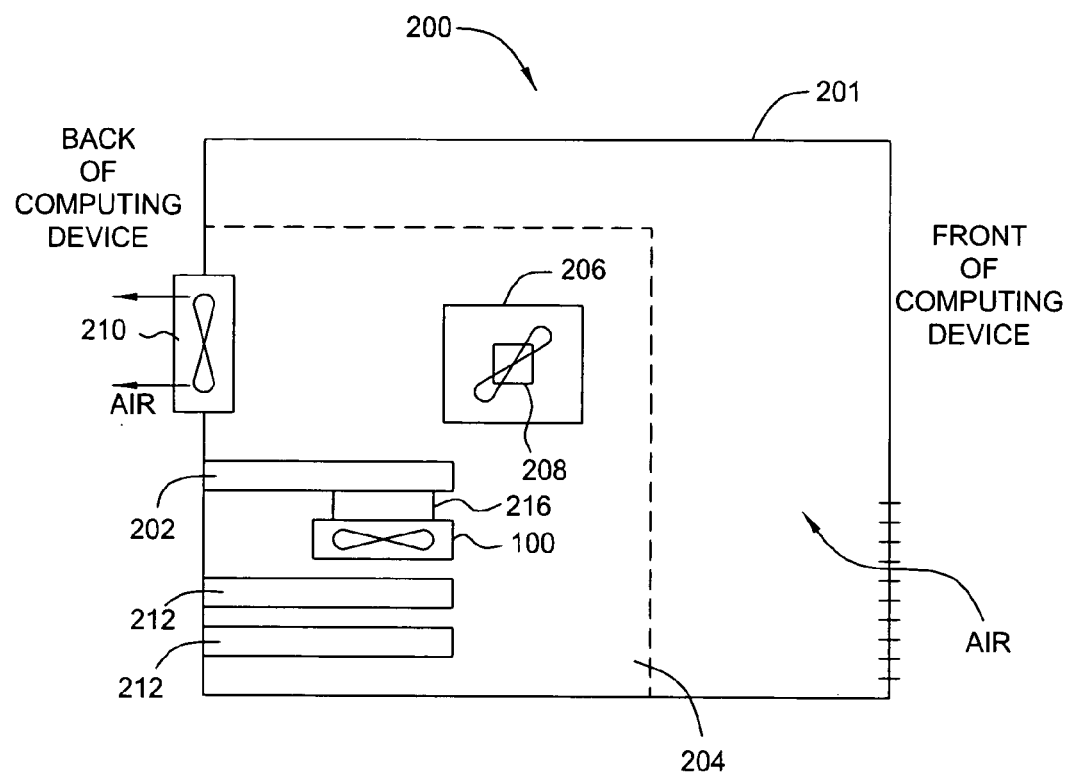
FIG. 2 is schematic diagram illustrating a computing device adapted for use with a system for cooling a processor, according to one embodiment of the present invention.
Figure 4A:
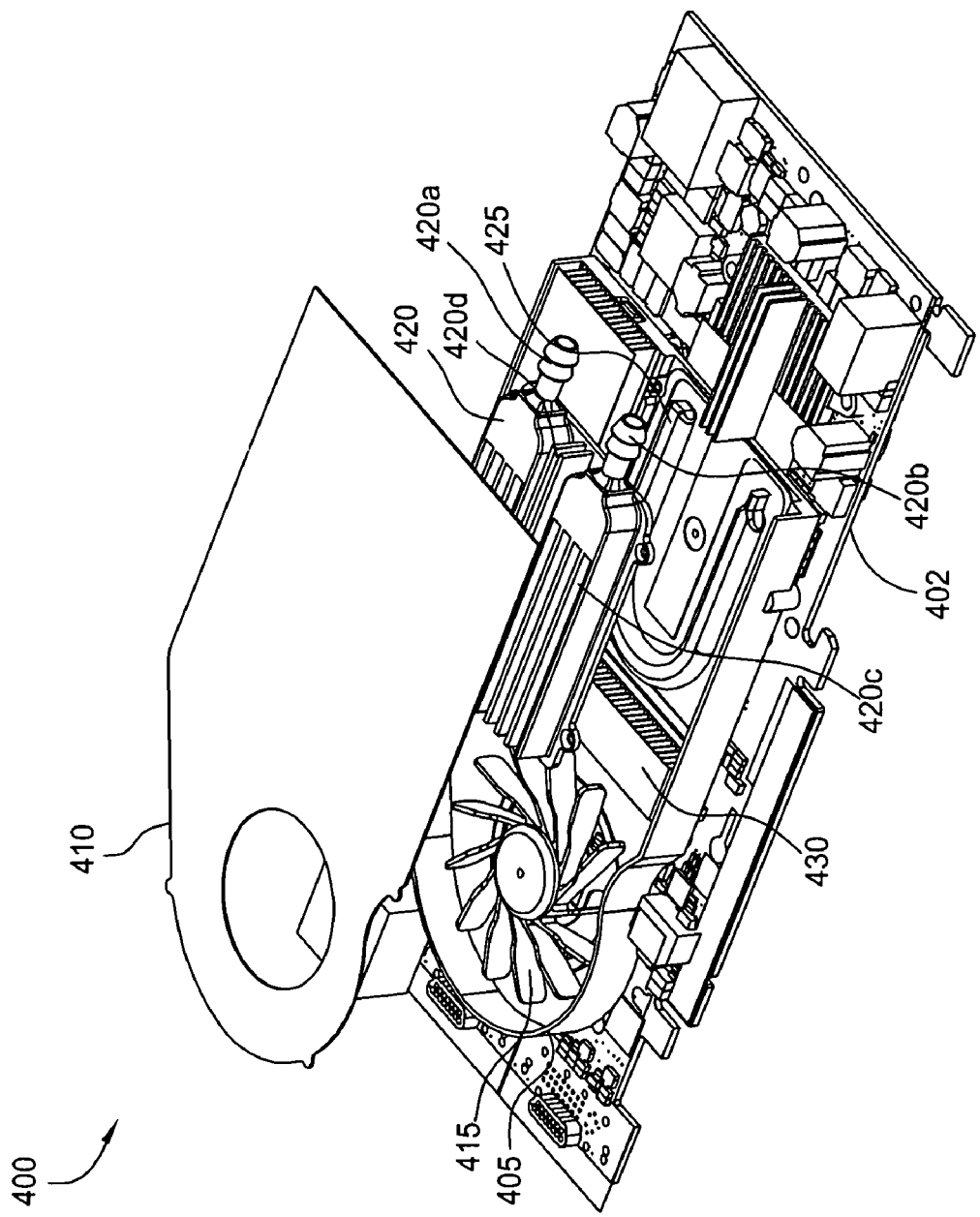
FIGS. 4A-C are various views/schematics of a hybrid cooling system with an embedded heat pipe, according to one embodiment of the present invention.

FIG. 4A is an exploded isometric view of a hybrid cooling system 400, according to one embodiment of the present invention. Hybrid cooling system 400 is configured to be thermally and structurally coupled to a printed circuit board (PCB), such as the graphics card 402 or the graphics card 202 of FIG. 2, and implemented with a computer system, such as the computer system 200 of FIG. 2. Mounted on a top side, the graphics card 402 includes GPU 416 (more clearly depicted in FIG. 4C) and other components, such as memory units (not shown) and a power supply (not shown). Preferably, the graphics card 402 is configured to connect to a computer system via a standard peripheral component interconnect PCI slot. Further, the hybrid cooling system 400 is configured so that when it is mounted to the graphics card 402, the cooling system 400 and the graphics card 402 will fit substantially within one standard PCI slot of a computer system. In alternate embodiments, the hybrid cooling system 400 may be configured to be coupled to any type of PCB for use in cooling a heat-generating electronic device mounted on that circuit board, such as an accelerated graphics port (AGP) card.

Figure 3:
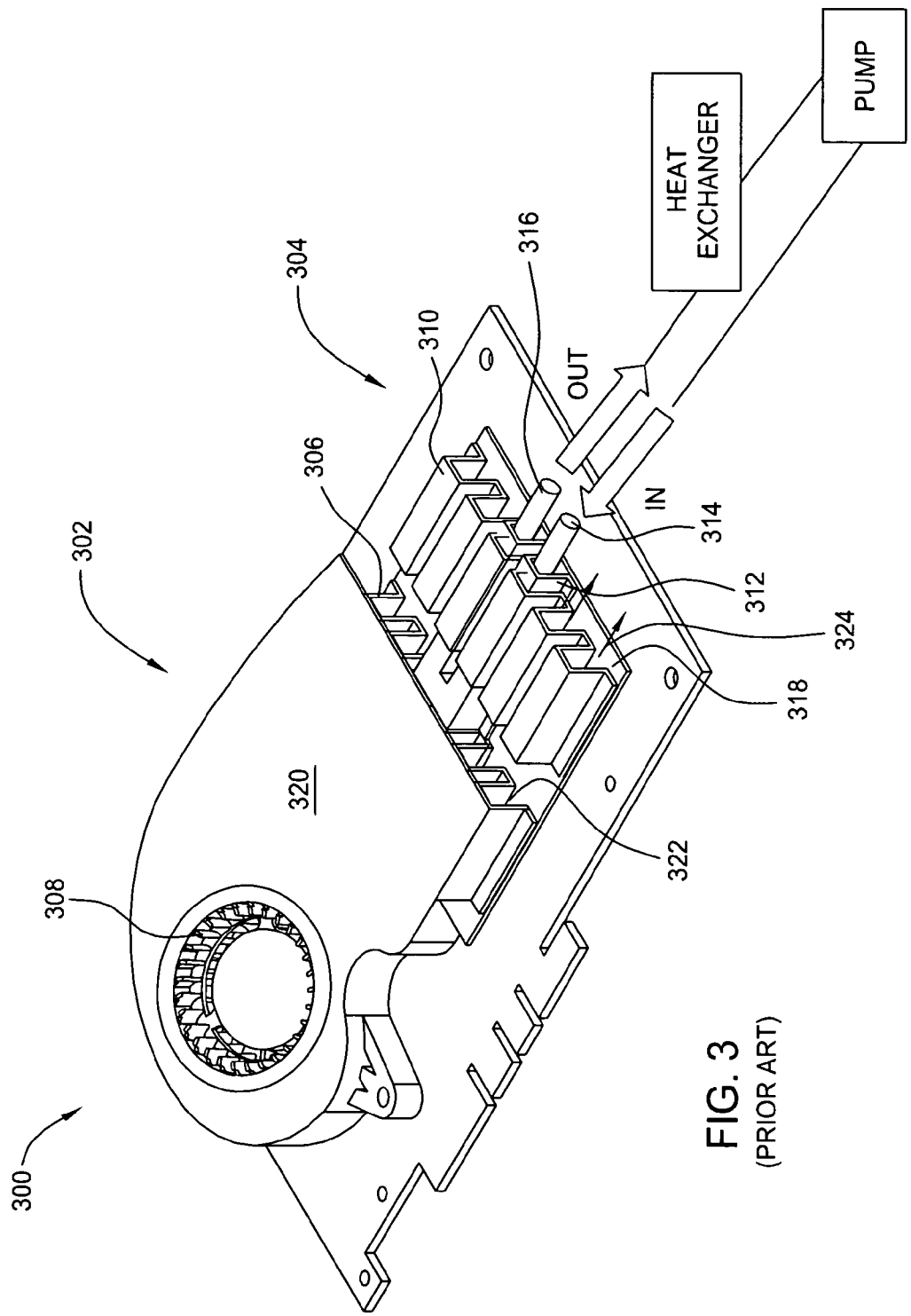
FIG. 3 is an isometric view illustrating a prior art hybrid cooling system for cooling a heat-generating electronic device.

The hybrid cooling system 400 includes, without limitation, a base 405, a lid 410, a fan 415, a hybrid cooling module 420, a heat pipe 425, a heat sink 430, a heat exchanger (as shown in FIG. 3) and a pump (as shown in FIG. 3). The base 405, the hybrid cooling module 420, the heat pipe 425, and the heat sink 430 are made from a thermally conductive material, such as aluminum or copper. The lid 410 and the fan 415 may be made from plastic or any other appropriate material.

Figure 4B:
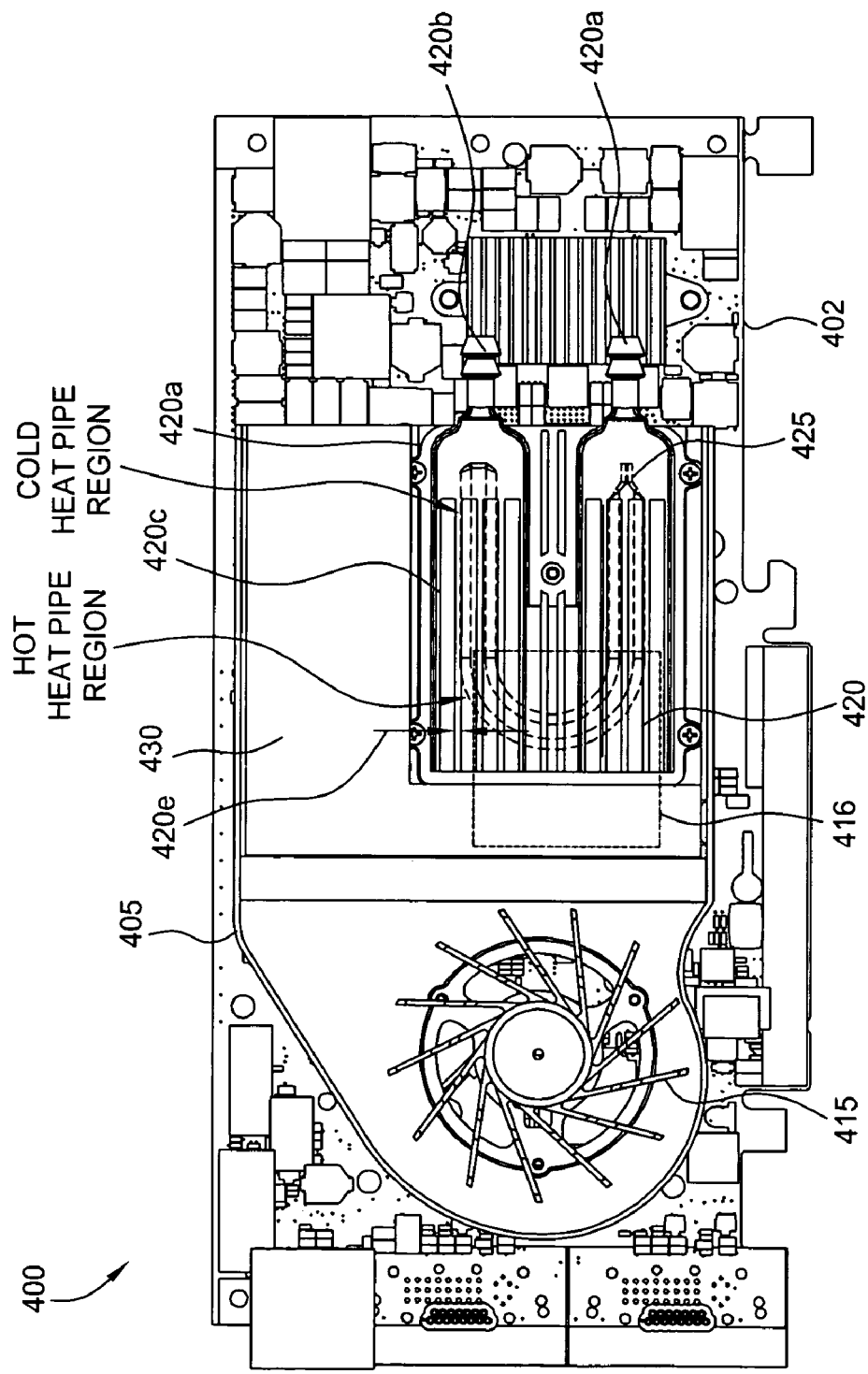

A bottom side of the base 405 is thermally coupled to the GPU 416 so as to conduct heat generated by the GPU 416 during operation. The base 405 may also be thermally coupled to other heat generating electronic devices on the graphics card 402, such as memory units and the power supply, to conduct heat generated by those electronic devices as well. The heat sink 430, also shown in FIG. 4B, is coupled to a top side of the base 405 over at least some of the memory units and at least a portion of the GPU 416 to enable heat generated by these devices and transferred through the base 405 to be transferred to air forced through air channels within the heat sink 430 by the fan 415. A second heat pipe (not shown) may be disposed beneath the heat sink 430 to improve heat distribution throughout the heat sink 430. As described in greater detail herein, the fan 415 forces air through the air channels 420e of the hybrid cooling module 420 to enable heat generated by the GPU 416 to be removed and transferred to the local environment.

Figure 4C:
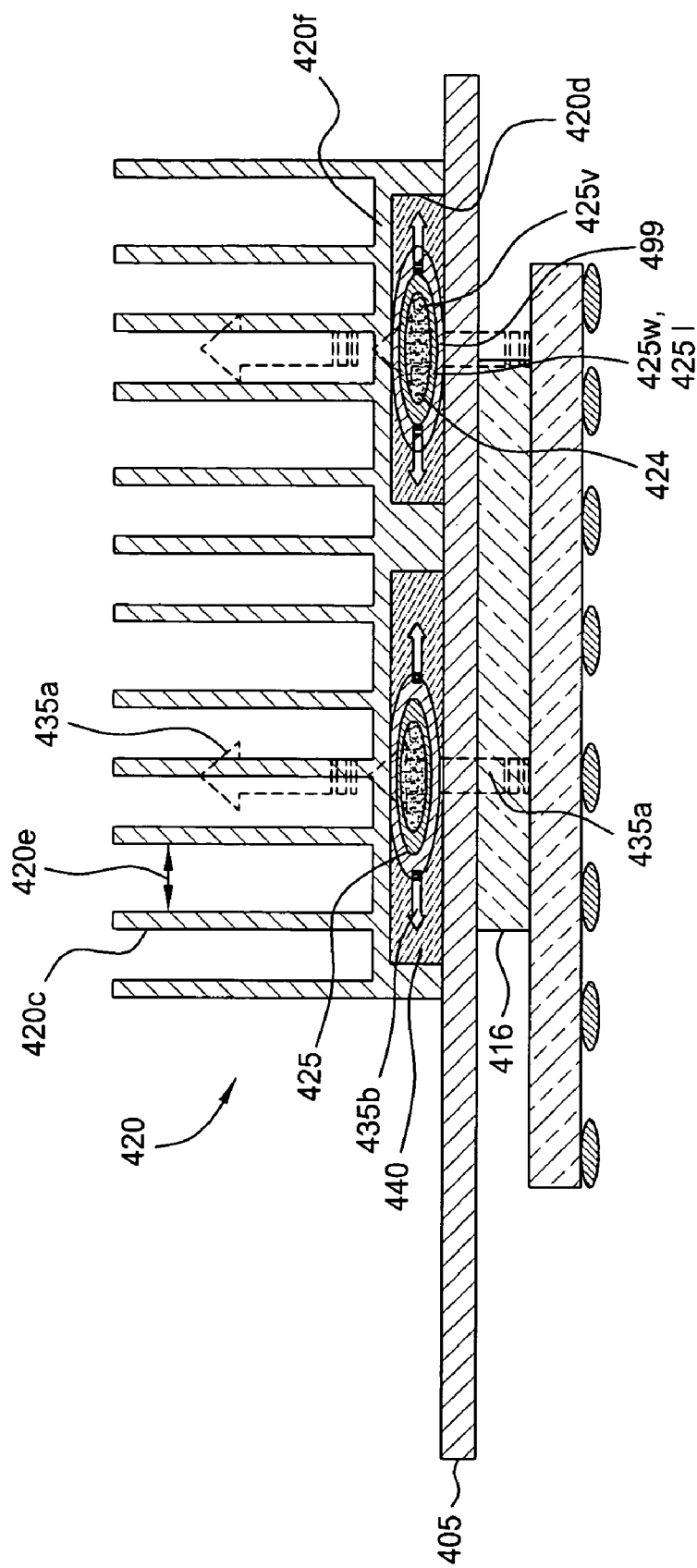

FIG. 4B is a top view of the hybrid cooling system 400 without the lid 410 and having hidden lines to show the embedded heat pipe 425 and the GPU 416. FIG. 4C is a sectional schematic of the hybrid cooling system 400. As shown, the hybrid cooling module 420 is coupled to the top side of the base 405 and is disposed laterally on the base 405 above the GPU 416. The hybrid cooling module 420 is mounted on to the base 405 so that a liquid channel 420d is formed between the base 405 and the hybrid cooling module 420. A seal (not shown) is disposed therebetween to prevent leakage of a heat transfer liquid 440 (e.g., water) within the liquid channel 420d. Alternatively, the hybrid cooling module 420 may have its own base, with the liquid channel formed between that base and a top 420f of the hybrid cooling module 420, and be sealed prior to installation on the base 405. The hybrid cooling module 420 includes a liquid inlet 420a and a liquid outlet 420b. The inlet 420a is coupled to an outlet of the pump via tubing (not shown), and the outlet 420b is coupled to an inlet of the heat exchanger via tubing (not shown). The pump and the heat exchanger may be located distally from the graphics card 402 in the computer chassis 201 or outside of the computer chassis 201. A plurality of fins 420c are formed in the top 420f of the hybrid cooling module 420. The fins 420c and the top 420f form air channels 420e through the hybrid cooling module 420, which may be covered by the lid 410. In one embodiment, the hybrid cooling module 420 is an integrated part, but in alternative embodiments, the components of the hybrid cooling module 420, such as the fins 420c and the top 420f, may be separate elements coupled together in some technically feasible fashion.

The heat pipe 425 is disposed in the liquid channel 420d. Preferably, the heat pipe 425 is press fit into the liquid channel 420d to ensure good contact with the base 405 and the top 420f of the hybrid cooling module 420. The heat pipe 425 may even be press fit to such an extent to deform the heat pipe 425 from an originally circular cross-section to a substantially oval-shape cross-section, as shown in FIG. 4C, to better ensure coupling between the base 405 and the top 420f of the hybrid cooling module 420. The heat pipe 425 may also be thermally coupled to the base 405 and the hybrid cooling module 420 with thermal adhesive or solder. The heat pipe 425 is formed in a substantially "U" shape so that a portion of the heat pipe 425 may substantially extend the length of each side of the liquid channel 420d. Alternatively, the heat pipe 425 may be substantially "S" shaped along the longitudinal axis to increase the contact area with the heat transfer liquid 440. As most clearly shown in FIG. 4B, the hybrid cooling module 420 is preferably disposed relative to the GPU 416 so that the curved portion of the heat pipe 425 resides above the GPU 416. The outside surface of the heat pipe 425 may be textured to increase the heat transfer rate from the heat pipe 425 to the heat transfer liquid 440. The workings of the heat pipe 425 are conventional and well-known by those skilled in the art.

In one embodiment, the heat pipe 425 is a passive heat transfer device, employing two-phase flow to achieve an extremely high thermal conductivity. The heat pipe 425 includes a vapor chamber 424 and a wick structure 425w which draws liquid 425l (e.g. water) to a heat source 499 (created by the heat generated by the GPU 416 and transferred through the base 405) by the use of capillary forces. The liquid 425l evaporates in the wick 425w when heated and the resulting vapor 425v escapes to the vapor chamber 424 of the heat pipe 425 where the vapor 425v is then forced by a resulting pressure gradient to cooler regions of the heat pipe 425 for condensation. The condensed liquid is then returned to the heat source 499 via the capillary action. Further detail on the design and implementation of heat pipes in electronics cooling applications may be found in an article by Scott D. Garner, P.E., entitled "Heat Pipes for Electronics Cooling Applications," available at http://www.electronics-cooling.com/resources/ECArticles/Sep96 02.htm, which is incorporated herein by reference.

Operation of the hybrid cooling system 400 will now be described. Heat flow from the GPU 416 and through the hybrid cooling module 420 is denoted by heat paths 435a and 435b. Heat is transferred from the GPU 416, through the base 405, and to the heat pipe 425. The heat vaporizes the liquid 425l in the wick 425w. The vapor 425v is forced away from the GPU 416 towards the cooler regions of the heat pipe 425, which are shown in FIG. 4B. As the vapor 425v travels through the heat pipe 425, heat is transferred through the sides of the heat pipe 425 to the heat transfer liquid 440 circulating within the liquid channel 420d (when the pump is operated), as depicted by heat path 435b. The heat transferred to the heat transfer liquid 440 is transported to the heat exchanger where it is dissipated into the local environment. Heat is also transferred through the top of the heat pipe 425 to the top 420f of the hybrid cooling module 420, as depicted by heat path 435a. The heat continues through the top 420f the fins 420c, where the heat is transferred to the air being forced through the air channels 420e by the fan 415. The heat is subsequently dissipated out into the local environment as well. When the pump is inoperative, and no heat transfer liquid 440 circulates through the liquid channel 420d, heat only travels along heat path 435a, as described above.

Disposing the heat pipe 425 in the liquid channel 420d improves the heat transfer capability of the cooling system 400 relative to the cooling system 300 when the pump is both inactive and active. When the pump is inactive, the heat pipe 425 remains operational, since it is a passive device, and thus provides a direct heat path 435a between the GPU 416 and the fins 420c. As such, the heat pipe 425 substantially improves heat transfer through the liquid channel 420d to the fins 420c versus the prior art hybrid cooling system 300 in which, as previously described, the non-circulating heat transfer liquid acts as an insulator and impedes the heat transfer between the GPU and the fansink portion of the system. When the pump is active, the sides of the heat pipe 425 increase the heat transfer surface area to which the circulating liquid 440 is exposed, thereby increasing the rate of heat transfer to the heat transfer liquid via heat path 435b relative to prior art systems.

Figure 5:
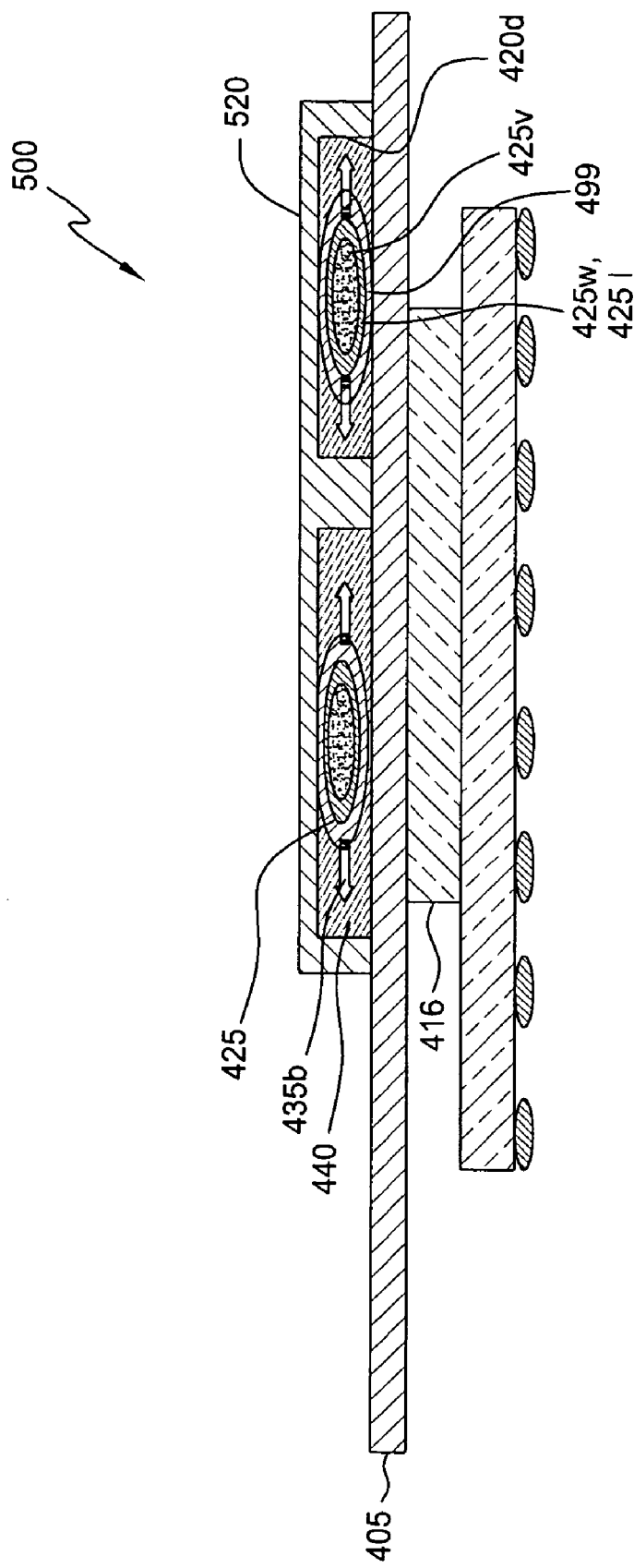
FIG. 5 is an illustration of a liquid-only cooling system with an embedded heat pipe, according to one embodiment of the present invention.

In an alternative embodiment, the heat pipe 425 may be added into a liquid channel of a liquid-only cooling system 500, thereby realizing the benefit of increasing the heat transfer area to the circulating heat transfer liquid 440, as described above. For example, as shown in FIG. 5, a housing 520 may be used instead of the hybrid cooling module 420, with a liquid channel 420d defined between the top portion of the housing 520 and the base 405. The heat pipe 425 is embedded in the liquid channel 420d, as previously described herein. Again, in operation, heat is transferred from the GPU 416, through the base 405, and to the heat pipe 425. The heat vaporizes the liquid 425l in the wick 425w. The vapor 425v is forced away from the GPU 416 towards the cooler regions of the heat pipe 425. As the vapor 425v travels through the heat pipe 425, heat is transferred through the sides of the heat pipe 425 to the heat transfer liquid 440 circulating within the liquid channel 420d, as depicted by heat path 435b.

In another alternative embodiment, the hybrid cooling system may be configured to be coupled to heat-generating electronic devices other than a GPU, such as a central processing unit (CPU), an application-specific integrated circuit (ASIC), another type of special purpose processing unit, memory elements and the like.

Although the invention has been described above with reference to specific embodiments, persons skilled in the art will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A system for cooling a heat-generating device, the system comprising:
   a base adapted to be coupled to the heat-generating device;
   a U-shaped housing coupled to the base, the heat generating device located over the base;
   a U-shaped liquid channel formed between the base and the housing wherein the housing forms a portion of the liquid channel, wherein a heat transfer liquid is circulated through the liquid channel to remove heat generated by the heat-generated device; and
   a U-shaped heat pipe disposed within the liquid channel, wherein the heat pipe increases the heat transfer surface area to which the heat transfer liquid is exposed, the heat pipe comprising a curved base portion adjacent the heat generating device and leg portions extending beyond the heat generating device to define cold heat pipe regions, the legs being coupled to a pump and a heat exchanger located at a distance from the heat generating device.

2. The system of claim 1 wherein the heat pipe includes a wick structure internal to the surface of the heat pipe for drawing liquid to the heat source through capillary attractors and a vapor chamber within the wick structure and central to the heat pipe for carrying heated vapor to the cold region of the heat pipe by a pressure gradient, the cooled liquid thereafter being returned to the region adjacent the heat generating device.

3. The system of claim 2, further comprising a plurality of fins coupled to a first side of the housing, wherein the housing has a second side forming the portion of the liquid channel.

4. The system of claim 3, wherein the plurality of fins and the housing form an integrated part.

5. The system of claim 3, further comprising a fan configured to force air through air channels defined between the fins.

6. The system of claim 2, wherein the heat pipe substantially extends the length of the fluid channel.

7. The system of claim 2, wherein an outer surface of the heat pipe is textured.

8. The system of claim 1, wherein the heat-generating device is a graphics processing unit.

9. The system of claim 8, wherein the graphics processing unit is disposed on a graphics card, and the system is configured to fit within one standard peripheral component interconnect slot.

10. The system of claim 1, wherein the heat-generating device is a central processing unit, an application-specific integrated circuit or a memory device.

11. A computer system configured with a cooling system, the computer system comprising:
   a heat-generating device, wherein the cooling system includes:
      a base coupled to the heat-generating device,
      a U-shaped housing coupled to the base, the heat generating device located over the base,
      a U-shaped liquid channel formed between the base and the housing housing forms a portion of the liquid channel, wherein a heat transfer liquid is circulated through the liquid channel to remove heat generated by the heat-generated device, and
      a U-shaped heat pipe disposed within the liquid channel, wherein the heat pipe increases the heat transfer surface area to which the heat transfer liquid is exposed, the heat pipe comprising a curved base portion adjacent the heat generating device and leg portions extending beyond the heat generating device to define cold heat pipe regions, the leas being coupled to a pump and a heat exchanger located at a distance from the heat generating device.

12. The system of claim 11 wherein the heat pipe includes a wick structure internal to the surface of the heat pipe for drawing liquid to the heat source through capillary attractors and a vapor chamber within the wick structure and central to the heat pipe for carrying heated vapor to the cold region of the heat pipe by a pressure gradient, the cooled liquid thereafter being returned to the region adjacent the heat generating device.

13. The computer system of claim 12, further comprising a plurality of fins coupled to a first side of the housing, wherein the housing has a second side forming the portion of the liquid channel.

14. The computer system of claim 13, wherein the plurality of fins and the housing form an integrated part.

15. The computer system of claim 13, further comprising a fan configured to force air through air channels defined between the fins.

16. The computer system of claim 12, wherein the heat pipe substantially extends the length of the fluid channel.

17. The computer system of claim 12, wherein the heat pipe is coupled to the housing and the base such that the heat pipe deforms from a circular cross-section to an oval-shape cross-section.

18. The computer system of claim 12, wherein an outer surface of the heat pipe is textured.

19. The computer system of claim 12, further including a pump configured to circulate the heat transfer liquid through the liquid channel, and a heat exchanger configured to receive the heat transfer liquid circulated through the liquid channel and to transfer heat from the heat transfer liquid to a local environment.

* * * * *

UNITED STATES PATENT AND TRADEMARK OFFICE
CERTIFICATE OF CORRECTION

PATENT NO.         : 7,551,442 B2
APPLICATION NO.    : 11/294825
DATED              : June 23, 2009
INVENTOR(S)        : Zoran Stefanoski It is certified that error appears in the above-identified patent and that said Letters Patent is hereby corrected as shown below:

In column 8, line 9, claim 11, please replace "housing, housing forms" with --housing, wherein the housing forms--.

In column 8, line 19, claim 11, please replace "the leas being" with --the legs being--.

Signed and Sealed this

Sixth Day of October, 2009

David J. Kappos
*Director of the United States Patent and Trademark Office*